US012730947B2

(12) United States Patent
Moriyasu et al.

(10) Patent No.: US 12,730,947 B2
(45) Date of Patent: Sep. 8, 2026

(54) MODEL LEARNING APPARATUS, CONTROL APPARATUS, MODEL LEARNING METHOD AND COMPUTER PROGRAM

(71) Applicants: KABUSHIKI KAISHA TOYOTA CHUO KENKYUSHO, Nagakute (JP); KABUSHIKI KAISHA TOYOTA JIDOSHOKKI, Kariya (JP)

(72) Inventors: Ryuta Moriyasu, Nagakute (JP); Taro Ikeda, Nagakute (JP); Masato Takeuchi, Kariya (JP)

(73) Assignees: KABUSHIKI KAISHA TOYOTA CHUO KENKYUSHO, Nagakute (JP); KABUSHIKI KAISHA TOYOTA JIDOSHOKKI, Kariya (JP)

( * ) Notice: Subject to any disclaimer, the term of this patent is extended or adjusted under 35 U.S.C. 154(b) by 1075 days.

(21) Appl. No.: 17/683,981

(22) Filed: Mar. 1, 2022

(65) Prior Publication Data

US 2022/0300683 A1 Sep. 22, 2022

(30) Foreign Application Priority Data

Mar. 17, 2021 (JP) ................................ 2021-044033

(51) Int. Cl.
*G06N 3/084* (2023.01)
*G06F 30/27* (2020.01)
(Continued)

(52) U.S. Cl.
CPC ............... *G06F 30/27* (2020.01); *G06N 3/04* (2013.01); *G06N 3/0499* (2023.01); *G06N 3/084* (2013.01)

(58) Field of Classification Search
CPC .......... G06N 3/04; G06N 3/063; G06N 3/084; G06F 30/25; G06F 30/27; G06F 30/28
See application file for complete search history.

(56) References Cited

U.S. PATENT DOCUMENTS 6,098,010 A * 8/2000 Krener .................. F04D 27/001 701/100
2014/0358831 A1 12/2014 Adams et al.
(Continued)

FOREIGN PATENT DOCUMENTS

JP 2018-116693 A 7/2018
JP 2020-051305 A 4/2020

OTHER PUBLICATIONS

Lynton Ardizzone, Jakob Kruse, Sebastian Wirkert, Daniel Rahner, Eric W. Pellegrini, Ralf S. Klessen, Lena Maier-Hein, Carsten Rother, Ullrich Kalthe. Analyzing Inverse Problems with Invertible Neural Networks, 2019, https://arxiv.org/abs/1808.04730 (Year: 2019).*
(Continued)

*Primary Examiner* — Ryan F Pitaro
*Assistant Examiner* — Jay Michael White
(74) *Attorney, Agent, or Firm* — Oliff PLC

(57) ABSTRACT

A model learning apparatus is configured to learn a model that shows a relationship between an input variable u input into a system and an output variable y output from the system. The model learning apparatus includes a storage that stores store a model used to learn a nonlinear equation of state for predicting the output variable y by using the input variable u; and a processor programmed to learn the equation of state by using the model and an input-output data set including a set of data of a steady-state value of the output variable y and data of the input variable u corresponding to the data of the steady-state value. The model is an equation of state including a bijective mapping ϕ that uses the output variable y as an input thereof.

7 Claims, 8 Drawing Sheets

(51) Int. Cl.
*G06N 3/04* (2023.01)
*G06N 3/0499* (2023.01)

(56) References Cited

U.S. PATENT DOCUMENTS

| | | | | |
|---|---|---|---|---|
| 2016/0160787 | A1* | 6/2016 | Allain | F02D 41/1401 701/103 |
| 2017/0308632 | A1* | 10/2017 | Hackney | G05B 17/02 |
| 2018/0168515 | A1 | 6/2018 | Farahmand et al. | |

OTHER PUBLICATIONS

J. A. Ruiz Vargas and E. M. Hemerly, "Neural adaptive observer for general nonlinear systems," Proceedings of the 2000 American Control Conference. ACC (IEEE Cat. No. 00CH36334), Chicago, IL, USA, 2000, pp. 708-712 vol. 1, doi: 10.1109/ACC.2000. 878993. (Year: 2000).*

T. Ikeda and K. Kashima, "On Sparse Optimal Control for General Linear Systems," in IEEE Transactions on Automatic Control, vol. 64, No. 5, pp. 2077-2083, May 2019, doi: 10.1109/TAC.2018. 2863220. (Year: 2019).*

K. Kashima, "Nonlinear model reduction by deep autoencoder of noise response data," 2016 IEEE 55th Conference on Decision and Control (CDC), Las Vegas, NV, USA, 2016, pp. 5750-5755, doi: 10.1109/CDC.2016.7799153. (Year: 2016).*

Ankush Chakrabarty, Emilia Fridman, StanisÅaw H. Å»ak, Gregery T. Buzzard, State and unknown input observers for nonlinear systems with delayed measurements, Automatica, vol. 95, 2018, pp. 246-253, ISSN 0005-1098 (Year: 2018).*

Driver's Ed Direct, "Speed Control" https://web.archive.org/web/20201021210615/https://www.driverseddirect.com/videos/speed-control/ (Year: 2020).*

Cottingham, Darren. "Tips for Keeping Under the Speed Limit". Driver Knowledge Tests. https://www.driverknowledgetests.com/resources/tips-for-keeping-under-the-speed-limit/ (Year: 2013).*

Toyota. "5 Easy Fuel Economy Driving Tips". https://www.toyota.com/car-tips/driving-tips-getting-best-fuel-economy/ (Year: 2016).*

Baratchart Laurent et al.; "Wiener-Hammerstein systems and harmonic identification", 2015 IEEE International Instrumentation and Measurement Technology Conference (I2MTC) Proceedings, May 11, 2015, pp. 612-617.

Apr. 10, 2025 Office Action issued in U.S. Appl. No. 17/499,546.

Nov. 6, 2024 Office Action issued in U.S. Appl. No. 17/499,546.

Chan et al., Model Predictive Control of Hammerstein Systems with Multivariable Nonlinearities, 2007, vol. 46, 168-180, Retrieved using ACS Publications from the Internet: (Year: 2007).

U.S. Appl. No. 17/499,546, filed Oct. 12, 2021 in the name of Moriyasu et al.

Optimal Control Via Neural Networks: A Convex Approach (Yize Chen, Yuanyuan Shi, Baosen Zhang URL: https://arxiv.org/abs/1805.11835).

Sep. 8, 2025 Office Action issued in U.S. Appl. No. 17/499,546.

May 12, 2026 Office Action issued in U.S. Appl. No. 17/499,546.

* cited by examiner

—: ACTUAL VALUE
---: PREDICTED VALUE
PARAMETER E
PARAMETER D
PARAMETER C
C0
PARAMETER B
PARAMETER A
A0
t1
t2
t3
t4
t5
t6
t7
t8
t9
t10
t11
TIME

—: ACTUAL VALUE
---: PREDICTED VALUE
PARAMETER E
PARAMETER D
PARAMETER C
PARAMETER B
PARAMETER A
Ad1
C0
A0
t1
t2
t3
t4
t5
t6
t7
t8
t9
t10
t11
TIME

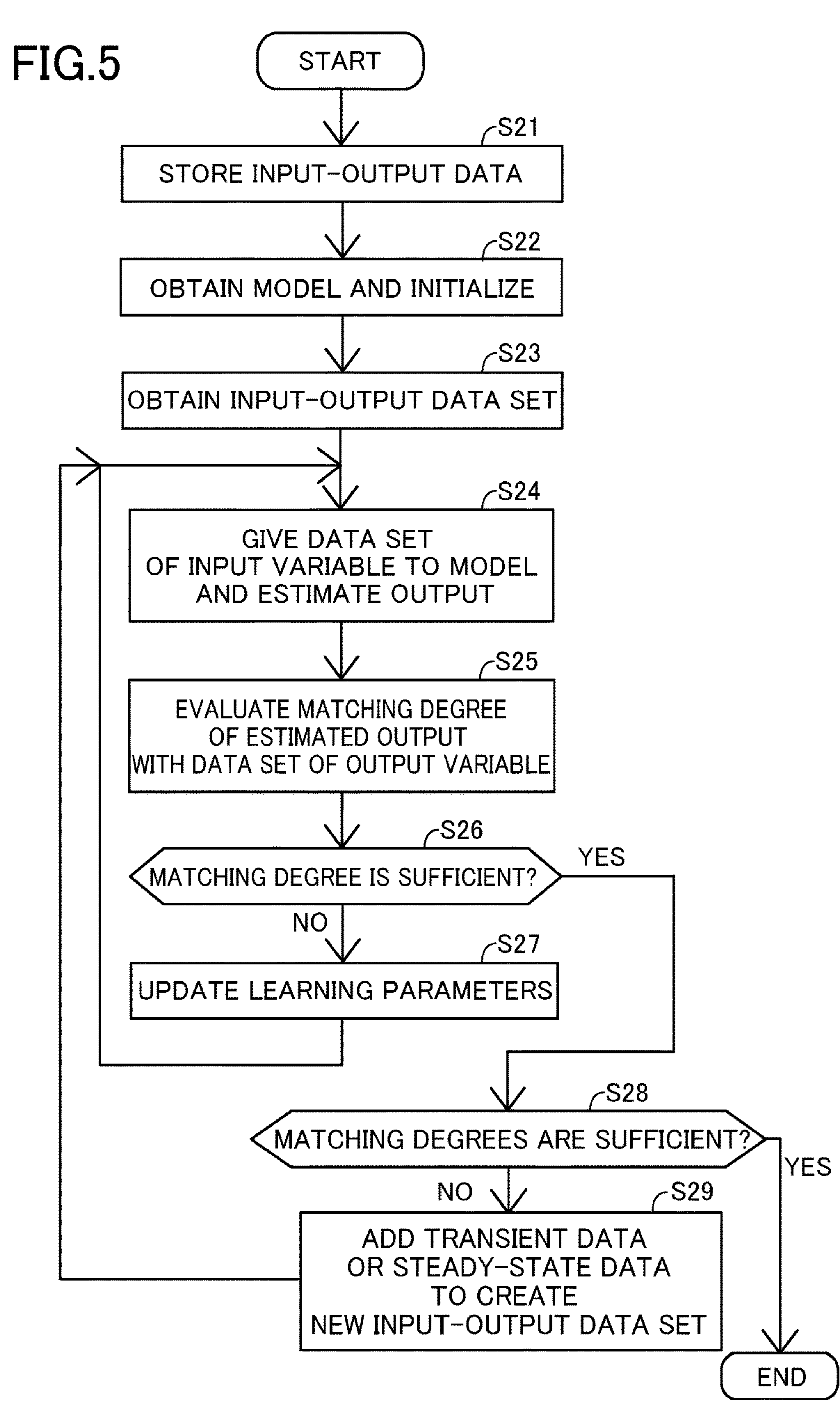
FIG.5
START
S21
STORE INPUT-OUTPUT DATA
S22
OBTAIN MODEL AND INITIALIZE
S23
OBTAIN INPUT-OUTPUT DATA SET
S24
GIVE DATA SET OF INPUT VARIABLE TO MODEL AND ESTIMATE OUTPUT
S25
EVALUATE MATCHING DEGREE OF ESTIMATED OUTPUT WITH DATA SET OF OUTPUT VARIABLE
S26
MATCHING DEGREE IS SUFFICIENT?
YES
NO
S27
UPDATE LEARNING PARAMETERS
S28
MATCHING DEGREES ARE SUFFICIENT?
YES
NO
S29
ADD TRANSIENT DATA OR STEADY-STATE DATA TO CREATE NEW INPUT-OUTPUT DATA SET
END —: ACTUAL VALUE
---: PREDICTED VALUE
PARAMETER E
PARAMETER D
PARAMETER C
PARAMETER B
PARAMETER A
Ad1
D1
A1
t1
t2
t3
t4
t5
t6
t7
t8
t9
t10
t11
t21
t22
TIME

MODEL LEARNING APPARATUS, CONTROL APPARATUS, MODEL LEARNING METHOD AND COMPUTER PROGRAM

CROSS-REFERENCE TO RELATED APPLICATION

The present application claims priority to Japanese Patent Application No. 2021-044033 filed on Mar. 17, 2021, the disclosure of which is hereby incorporated by reference in its entirety.

TECHNICAL FIELD

The present disclosure relates to a model learning apparatus, a control apparatus, a model learning method, and a computer program.

BACKGROUND

A model learning apparatus has conventionally been known to learn a model showing a relationship between an input into a system as a control object and an output from the system. For example, Patent Literature JP 2018-116693 discloses a technique of learning a model that estimates a state of a system, based on time series data showing a relationship between an input and an output of the system.

SUMMARY

Technical Problem

The proposed techniques described above, however, still have some room for improvement with respect to the technique involved in the model learning apparatus to learn a model that improves the prediction accuracy of a steady-state value output from the system in a steady state. For example, the technique of Patent Literature 1 learns the model, based on time series data in the system in a transient state. Accordingly, a value to which an output is eventually converged in response to a certain input, i.e., an estimated steady-state value of the output estimated from this model, is likely to be different from a steady-state value actually output from the system in the steady state. In the model learnt to approach the time series data of the system having the output changing transiently, the result of prediction of the steady-state value by the model as the result of learning a transient change may not favorably match the actual steady-state value.

In order to solve the problems described above, with respect to a model learning apparatus, an object of the present disclosure is to provide a technique of learning a model that improves the prediction accuracy of a steady-state value output from a system in a steady state.

Solution to Problem

The present disclosure may be implemented by aspects described below to solve the problems described above.

(1) According to one aspect of the present disclosure, there is provided a model learning apparatus configured to learn a model that shows a relationship between an input variable u input into a system and an output variable y output from the system. This model learning apparatus comprises a model storage portion configured to store a model used to learn a nonlinear equation of state for predicting the output variable y by using the input variable u; and a learning portion configured to learn the equation of state by using the model and an input-output data set including a set of data of a steady-state value of the output variable y and data of the input variable u corresponding to the data of the steady-state value. The model is an equation of state including a bijective mapping $\phi$ that uses the output variable y as an input thereof.

In the model learning apparatus of this aspect, the learning portion learns the equation of state that is the model, by using the input-output data set including the data of the steady-state value of the output variable y and the data of the input variable u corresponding to the data of the steady-state value. More specifically, the learning portion learns the equation of state by using the set of the data of the output variable and the data of the input variable in the system in the steady state, in addition to the set of the data of the output variable and the data of the input variable in the system in the transient state. The model learnt by the model learning apparatus of this aspect is accordingly the model that takes into account the prediction accuracy of the output in the system in the steady state. Furthermore, in the configuration of this aspect, the model showing the relationship between the input variable and the output variable in the system is the equation of state including the bijective mapping $\phi$ with the output variable y as its input. This configuration enables the steady-state value of the output variable corresponding to the input variable to be determined uniquely. This configuration provides a relatively small difference between an estimated value of the uniquely determined steady-state value and an actual steady-state value. The model learning apparatus of this aspect is accordingly enabled to learn the model that improves the prediction accuracy of the steady-state value.

(2) In the model learning apparatus of the above aspect, the model may be defined by an expression (1);

[Math. 8]

$$\dot{y} = \left(\frac{\partial \Phi}{\partial y}\right)^{-1} \left\{ A(u)\Phi(y, u) + f(u) - \frac{\partial \Phi}{\partial u}\dot{u} \right\} \tag{1}$$

where a left side of an equal sign is a time derivative of an n-dimensional vector that indicates the output variable y, where n denotes an integer number; and in a right side of the equal sign, the input variable u is an m-dimensional vector that indicates an input variable affecting a change of the output variable y, where m denotes an integer number; a function A is a function that gives an n×n matrix by using the input variable u as an input thereof; the mapping $\phi$ is a function that gives an n-dimensional vector by using the output variable y and the input variable u as inputs thereof; a function f is a function that gives an n-dimensional vector by using the input variable u as an input thereof; and a sign with a dot over the input variable u denotes a time derivative of the input variable u.

In the model learning apparatus of this aspect, the mapping $\phi$ is a bijective mapping with the output variable y and the input variable u as its inputs. For example, in the case of using a function G, Expression (1) may be formally rewritten to provide $G^{-1}=\phi$. The model of Expression (1) includes the functions A(u) and f(u) with the input variable u as their inputs and also includes a time derivative term of the input variable u. The model of Expression (1) accordingly serves as a model that explicitly expresses the steady-state value of the output variable y corresponding to the input variable u and is thus enabled to determine the steady-state value of the output variable y output from the system in the steady state, as well as the output variable y output from the system in the transient state, with high accuracy. The model learning apparatus of this aspect is accordingly enabled to learn the model that improves the prediction accuracy of the steady-state value output form the system in the steady state.

(3) In the model learning apparatus of the above aspect, in the expression (1), when an output of the mapping $\phi$ with the output variable y and the input variable u as inputs thereof is defined as an internal variable x, the learning portion may learn the equation of state defined by an expression (2) and an expression (3):

[Math. 9]

$$\dot{x}=A(u)x+f(u) \tag{2}$$

[Math. 10]

$$y=\Phi^{-1}(x,u) \tag{3}$$

In the model learning apparatus of this aspect, the equation of state of Expression (1) is linearized with respect to the internal variable x by defining the output of the mapping $\phi$ with its inputs set to the output variable y and the input variable u, as the internal variable x in the equation of state of Expression (1). This causes the equation of state shown by Expression (1) to serve as a model that explicitly expresses the steady-state value of the output variable corresponding to the input variable in the system in the steady state. The model learning apparatus of this aspect is accordingly enabled to learn the model that improves the prediction accuracy of the steady-state value output form the system in the steady state.

(4) In the model learning apparatus of the above aspect, the mapping $\phi$ may be defined by an expression (4) to an expression (7):

[Math. 11]

$$\Phi(y,u)=y_{\Phi}^{(L_{\Phi})} \tag{4}$$

[Math. 12]

$$-y_{\Phi}^{(i)}=\Phi_{\Phi}^{(i)}\left(x_{\Phi}^{(i)},u\right) \tag{5}$$

[Math. 13]

$$x_{\Phi}^{(i)}=W_{\Phi}^{(i)}(u)y_{\Phi}^{(i-1)}+b_{\Phi}^{(i)}(u) \tag{6}$$

[Math. 14]

$$y_{\Phi}^{(0)}=y \tag{7}$$

where i denotes a layer number in a multilayer neural network; $L_{\phi}$ denotes number of layers in the multilayer neural network; $\phi_{\phi}$ is an activation function and denotes an arbitrary bijective mapping that gives an output of an identical dimension with a dimension of an input thereof; $W_{\phi}$ denotes a weight; and $b_{\phi}$ denotes a bias.

In the model learning apparatus of this aspect, the mapping $\phi$ is defined by using the multilayer neural network. This enables the value of the output variable y estimated by Expression (1) to approach an actual output of the system by adjusting the weight $W_{\phi}$ and the bias $b_{\phi}$ in each layer of the multilayer neural network. The model learning apparatus of this aspect is accordingly enabled to learn the model that predicts an actual output of the system with high accuracy.

(5) In the model learning apparatus of the above aspect, the learning portion may be configured to: give a data set of the input variable that is included in the input-output data set and that includes the data of the input variable u corresponding to the data of the steady-state value, to the model and estimate an output; evaluate a matching degree of the estimated output with a data set of the output variable that is included in the input-output data set and that includes the data of the steady-state value of the output variable y; and update a learning parameter of the model according to a result of the evaluation, so as to learn the equation of state.

In the model learning apparatus of this aspect, the learning portion estimates the output by using the data set of the input variable that is included in the input-output data set and that includes the data of the input variable u corresponding to the data of the steady-state value of the output variable y. The learning portion evaluates the matching degree of the estimated output with the data set of the output variable y that is included in the input-output data set and that includes the data of the steady-state value of the output variable y and updates the learning parameter of the model according to the result of the evaluation, so as to learn the equation of state. The learning portion evaluates the equation of state learnt by using the data set of the input variable including the data of the input variable u corresponding to the data of the steady-state value and thereby modifies the learnt model to a model having the higher prediction accuracy. The model learning apparatus of this aspect is accordingly enabled to learn the model that further improves the prediction accuracy of the steady-state value.

(6) In the model learning apparatus of the above aspect, the learning portion may be configured to: give a data set of the input variable that is included in the input-output data set and that includes the data of the input variable u corresponding to the data of the steady-state value, to the model and estimate an output; evaluate a matching degree of the estimated output with a data set of the output variable that is included in the input-output data set and that includes the data of the steady-state value of the output variable y; create a new input-output data set according to a result of the evaluation by adding a new set of data of a steady-state value of the output variable y and data of the input variable u corresponding to the data of the steady-state value, to the input-output data set used for the estimation of the output and the evaluation of the matching degree; and learn the equation of state by using the new input-output data set.

In the model learning apparatus of this aspect, the learning portion gives the data set of the input variable included in the input-output data set, to the model to estimate an output and evaluates the matching degree of the estimated output with the data set of the output variable included in the input-output data set. Based on the result of this evaluation, the learning portion newly learns the equation of state by using an input-output data set newly created by addition of a new set of data of the steady-state value of the output variable y and data of the input variable u corresponding to the data of the steady-state value to the input-output data set used for the estimation of the output and for the evaluation of the matching degree. For example, in the case of insufficient matching degree with the output variable y in the system in the steady-state, addition of the learning data with regard to the steady-state value improves the prediction accuracy of the steady-state value. The model learning apparatus of this aspect is accordingly enabled to learn the model that further improves the prediction accuracy of the steady-state value.

(7) According to another aspect of the present disclosure, there is provided a control apparatus configured to control a system. This control apparatus comprises the model learning apparatus of the above aspect; and a determination portion configured to determine the input variable u corresponding to a target value of the output variable y by using the equation of state learnt by the learning portion.

In the control apparatus of this aspect, the determination portion uses the equation of state learnt by the model learning apparatus of the above aspect to determine the input variable corresponding to the target value of the output variable. The control apparatus inputs the input variable determined by the determination portion into the system and thereby controls the system such as to make the output of the system especially in the steady state equal to a target steady-state value.

(8) According to another aspect of the present disclosure, there is provided a model learning method of learning a model that shows a relationship between an input variable u input into a system and an output variable y output from the system. This model learning method comprises a process of obtaining a model used to learn a nonlinear equation of state for predicting the output variable y by using the input variable u; and a process of learning the equation of state by using the model and an input-output data set including a set of data of a steady-state value of the output variable y and data of the input variable u corresponding to the data of the steady-state value. The model is an equation of state including a bijective mapping $\phi$ that uses the output variable y as an input thereof.

In the model learning method of this aspect, the learning process learns the equation of state including the bijective mapping $\phi$ with the output variable y as its input, by using the input-output data set including the data of the steady-state value of the output variable y and the data of the input variable u corresponding to the data of the steady-state value. The learnt model is accordingly a model that is enabled to uniquely determine the steady-state value of the output variable corresponding to the input variable and that takes into account the prediction accuracy of the output in the system in the steady state. The model learning method of this aspect is thus enabled to learn the model that improves the prediction accuracy of the steady-state value.

(9) According to another aspect of the present disclosure, there is provided a computer program that causes an information processing apparatus to perform leaning of a model that shows a relationship between an input variable u input into a system and an output variable y output from the system. This computer program causes the information processing apparatus to perform: a function of obtaining a model used to learn a nonlinear equation of state for predicting the output variable y by using the input variable u; and a function of learning the equation of state by using the model and an input-output data set including a set of data of a steady-state value of the output variable y and data of the input variable u corresponding to the data of the steady-state value. The model is an equation of state including a bijective mapping $\phi$ that uses the output variable y as an input thereof.

In the computer program of this aspect, the learning function learns the equation of state including the bijective mapping $\phi$ with the output variable y as its input, by using the input-output data set including the data of the steady-state value of the output variable y and the data of the input variable u corresponding to the data of the steady-state value. The model learnt by the information processing apparatus is accordingly a model that is enabled to uniquely determine the steady-state value of the output variable corresponding to the input variable and that takes into account the prediction accuracy of the output in the system in the steady state. The computer program of this aspect is thus enabled to learn the model that improves the prediction accuracy of the steady-state value.

The present disclosure may be implemented by a variety of aspects: for example, an apparatus and a method of learning a model of a nonlinear system; an apparatus and a method of estimating a state by using a model obtained by learning; a system including these apparatuses; a computer program executed in these apparatuses and the system; a server apparatus configured to deliver the computer program; and a non-transitory storage medium configured to store the computer program therein.

BRIEF DESCRIPTION OF DRAWINGS

FIG. 5 is a flowchart showing a model learning method according to a second embodiment;

DESCRIPTION OF EMBODIMENTS

First Embodiment

Figure 1:
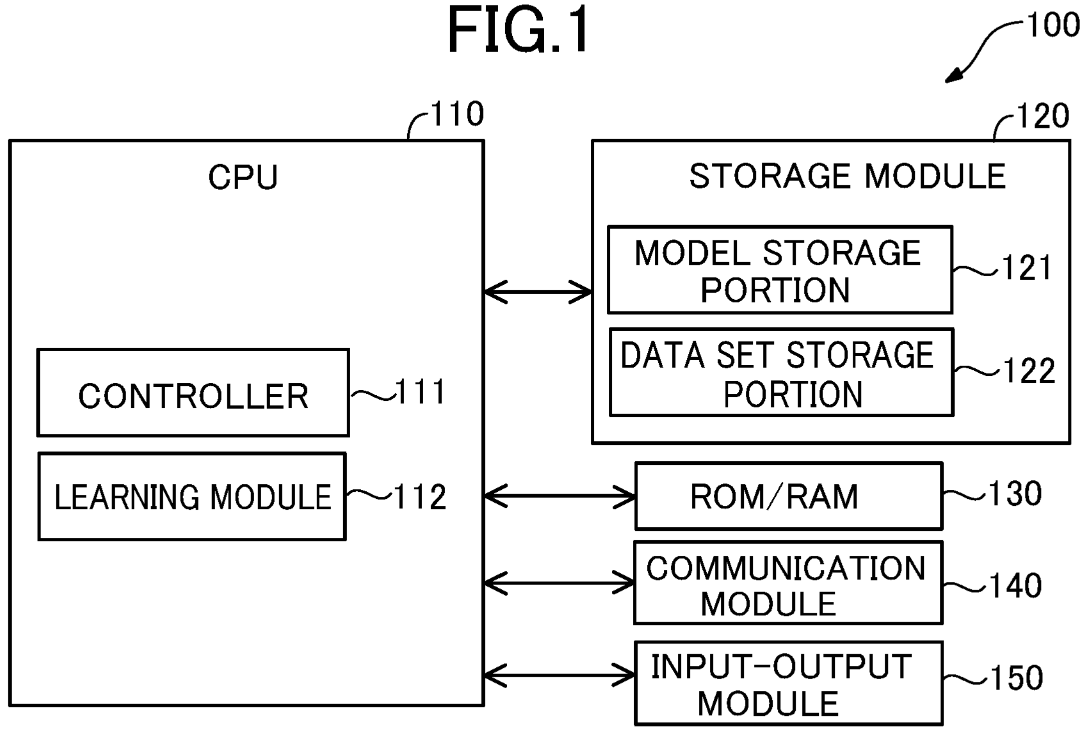
FIG. 1 is a schematic diagram illustrating the configuration of a model learning apparatus according to a first embodiment.

FIG. 1 is a schematic diagram illustrating the configuration of a model learning apparatus 100 according to a first embodiment. The model learning apparatus 100 of this embodiment learns a model of a nonlinear control object (system) having such a characteristic that a relationship between an input parameter and an output parameter is not expressed by or is not approximated by a linear expression. According to this embodiment, the "model" is a nonlinear equation of state and is more specifically an equation of state that is learnt from experimental data, simulation data and the like and that approximately expresses a time change relating to an output from the system relative to an input into the system. More specifically, the model learning apparatus 100 learns a nonlinear equation of state that predicts an output variable y of a nonlinear system as a result of control with an input variable u input into the system by regarding a state of the system as the output variable y output from the system. The "equation of state" means an equation that determines an output variable thereof y·(t) by using an output variable y(t) at a present time t, like "y·(t)=f(y(t), . . . )". Hereinafter, as a matter of convenience of notation, a time derivative of an arbitrary variable z is expressed as "z·", and the value of the arbitrary variable z having a time derivative equal to 0 is expressed as "$z^{-}$".

According to the embodiment, the system as an object of model learning by the model learning apparatus 100 includes, for example, an internal combustion engine, a hybrid engine, a power train or the like. When the system is a driving engine such as an internal combustion engine, a hybrid engine, or a power train, the model to be learnt by the model learning apparatus 100 is a nonlinear equation of state that indicates a relationship of a variety of parameters relating to driving of the system, for example, an operation amount of an actuator, a disturbance to the system, a state of the system, an output of the system, and an output target value of the system. When an internal combustion engine mounted on a vehicle is assumed as the system of the embodiment, the model learning apparatus learns the equation of state for predicting an output value of the internal combustion engine, an emission amount of carbon dioxide, and an emission amount of hydrocarbons, which are output from the internal combustion engine, as the output variable y, in response to input of an accelerator position, a speed of the vehicle and an acceleration of the vehicle as the input variable u. When a hybrid engine comprised of an internal combustion engine and a motor mounted on a vehicle is assumed as the system of the embodiment, the model learning apparatus learns the equation of state for predicting an output value of the internal combustion engine, an output value of the motor, a power storage amount of a battery, and a limiting value of the power storage amount, which are output from the hybrid engine, as the output variable y, in response to input of an accelerator position, an operation amount of a brake and an acceleration of the vehicle as the input variable u.

The model learning apparatus 100 is configured by, for example, a computer and includes a CPU 110, a storage module 120, a ROM/RAM 130, a communication module 140, and an input-output module 150. The respective components of the model learning apparatus 100 are connected with each other by means of buses. The model learning apparatus 100 corresponds to the "information processing apparatus" described in the claims.

The CPU 110 includes a controller 111 and a learning module 112. The controller 111 loads a computer program stored in the ROM 130 and expands and executes the computer program on the RAM 130 to control the respective components of the model learning apparatus 100. The CPU 110 may alternatively be one of a plurality of CPUs with a similar hardware configuration, where each CPU executes the computer program. The CPU may either include or be a neural processing unit (NPU) that is specifically designed to accelerate machine learning. The learning module 112 functions to learn a nonlinear equation of state for predicting an output variable y that indicates a state of an arbitrary system (nonlinear system). The learning module 112 may be a software program such as a machine learning algorithm executed by the CPU 110. The details of the functions of the learning module 112 will be described later.

The storage module 120 is a storage medium configured by a hard disk, a flash memory, a memory card or the like. In other words, the storage module 120 may be a nonvolatile computer-readable storage medium. The storage module 120 includes a model storage portion 121 and a data set storage portion 122. The model storage portion 121 stores in advance a model that is used to learn the equation of state by the learning module 112. According to the embodiment, the model stored in the model storage portion 121 is an equation of state including a bijective mapping $\phi$ that uses the output variable y as an input thereof and is defined by Expression (1) given below. The term "bijective" herein means a state that, when the result of mapping of a set A is a set B, respective elements of the set A and respective elements of the set B necessarily have a one-to-one mapping relationship. This is synchronous with, for example, a state that a bijective function g assures the presence of a unique inverse function $g^{-1}$.

[Math. 15]

$$\dot{y}=\left(\frac{\partial\Phi}{\partial y}\right)^{-1}\left\{A(u)\Phi(y,u)+f(u)-\frac{\partial\Phi}{\partial u}\dot{u}\right\} \quad (1)$$

In the above expression, a left side of an equal sign is a time derivative of an n-dimensional vector (where n denotes an integer number) that indicates the output variable y. In a right side of the equal sign, the input variable u is an m-dimensional vector (where m denotes an integer number) that indicates the input variable affecting a change of the output variable y; a function A is a function that gives an n×n matrix by using the input variable u as an input thereof; the mapping $\phi$ is a function that gives an n-dimensional vector by using the output variable y and the input variable u as inputs thereof; and a function f is a function that gives an n-dimensional vector by using the input variable u as an input thereof.

The data set storage portion 122 stores an input-output data set including a set of data of a steady-state value of the output variable y and data of the input variable u corresponding to the data of the steady-state value, with regard to the model expressed by Expression (1). The "steady-state value of the output variable y" herein denotes a value to which an output of the system is eventually converged, in response to a certain input into the system, and is, for example, an output value in the state that the output of the system is stable. The "data of the input variable u corresponding to the data of the steady-state value" denotes data of an input value input into the system at a certain time in the case where an output of the system is a steady-state value at the same certain time. The "set of the data of the output variable y and the data of the input variable u" denotes a combination of a value input into the system at a certain time and a value output from the system at the same certain time. The input-output data set is determined in advance by experiment or calculation with regard to the system. The input-output data set stored in the data set storage portion 122 is used as teaching data for learning the equation of state by the learning module 112. The details of the input-output data set will be described later.

The communication module 140 controls communication via a communication interface between the model learning apparatus 100 and another apparatus. Another apparatus is, for example, a control apparatus configured to control the system, another information processing apparatus, or a measuring instrument configured to obtain the input-output data set from the data set storage portion 122. The communication module 140 may include wired communication circuitry, such as controller area network (CAN) bus circuitry or Ethernet communication circuitry. The communication module may in other embodiments include wireless communication circuitry with an antenna to enable wireless communication by Wi-Fi, LTE, or Bluetooth. The input-output module 150 serves as various interfaces used for input and output of information by a user. Examples of the input-output module 150 include a touch panel, a keyboard, a mouse, an operation button, and a microphone as an input portion and a touch panel, a monitor, a speaker, and an LED (light emitting diode) indicator as an output portion.

Figure 2:
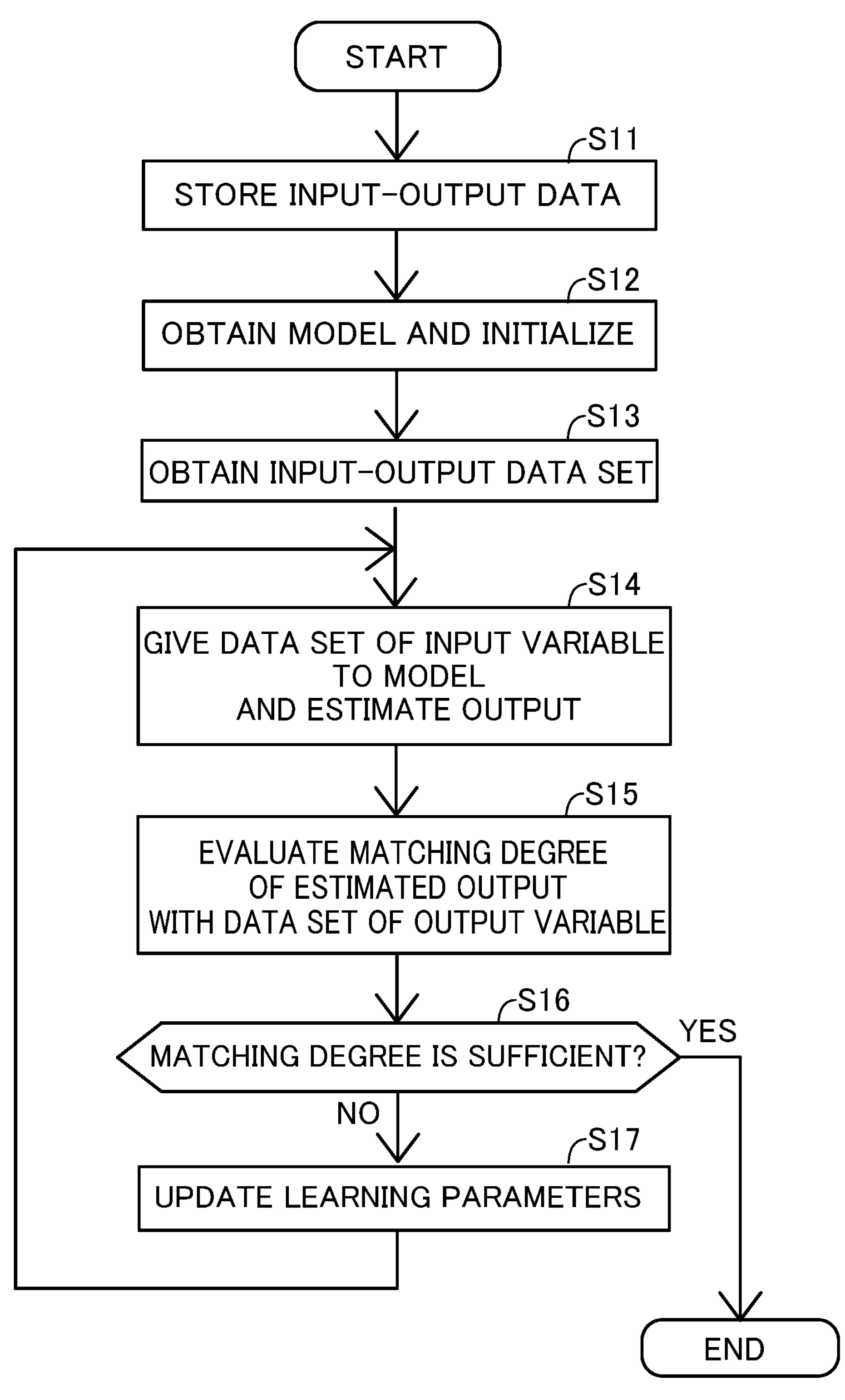
FIG. 2 is a flowchart showing a model learning method according to the first embodiment.

FIG. 2 is a flowchart showing a model learning method according to the first embodiment. The model learning method in the model learning apparatus 100 is performed, for example, in response to a user's request, such as activation of a predetermined application. According to the embodiment, the model learning method learns (estimates) a function form of a function F expressed by Expression (8) given below by using a known input-output data set including an output variable y, an input variable u, a time derivative y· of the output variable y, and a time derivative u· of the input variable u in the equation of state shown by Expression (1). In this embodiment, the output variable y is an n-dimensional vector, and the input variable u is an m-dimensional vector.

[Math. 16]

$$\dot{y}(t)=F(y,u) \tag{8}$$

In the model learning method of the first embodiment, the data set storage portion 122 first stores an input-output data set (step S11). More specifically, the data set storage portion 122 stores a set of data of input values into the system and data of output values from the system in a time period of a fixed time length, which are input into the model learning apparatus 100 via the input-output module 150, as the input-output data set. Accordingly, the input-output data set includes a dataset of the output variable including data of output values and a data set of the input variable including data of input values. With regard to an operating status of the system, the state having a time variation of the output value is defined as "transient state" and the state having no time variation of the output value is defined as "steady state". The data set of the output variable includes data of an output value output from the system in the transient state (hereinafter referred to as "transient-time output value"), data of a time derivative value of the transient-time output value, and data of an output value output from the system in the steady state, i.e., data of the steady-state output value. The data set of the input variable includes an input value input into the system in the transient state (hereinafter referred to as "transient-time input value"), data of a time derivative value of the transient-time input value, an input value input into the system in the stead state (hereinafter referred to as "steady-state input value"), and data of a time derivative value of the stead-state input value. The data set of the input variable accordingly includes data of the input variable u corresponding to the data of the steady-state value. A set of the transient-time input value, the time derivative value of the transient-time input value, the transient-time output value and the time derivative value of the transient-time output value, which are stored in the data set storage portion 122, is referred to as "data set of transient data". A set of the steady-state input value and the stead-state output value, which are stored in the data set storage portion 122, is referred to as "data set of steady-state data".

The learning module 112 subsequently obtains a model that is stored in the model storage portion 121 (step S12). More specifically, the learning module 112 assumes a model for learning the function F described above as the equation of state expressed by Expression (1) given below. The learning module 112 sets each of the values of the respective variables to zero or a random value in the equation of state expressed by Expression (1), so as to initialize the respective variables:

[Math. 17]

$$\dot{y}=\left(\frac{\partial\Phi}{\partial y}\right)^{-1}\left\{A(u)\Phi(y,u)+f(u)-\frac{\partial\Phi}{\partial u}\dot{u}\right\} \tag{1}$$

According to the embodiment, the learning module 112 defines an output of the mapping ϕ with inputs thereof set to the output variable y and the input variable u included in Expression (1), as an internal variable x expressed by Expression (9) given below:

[Math. 18]

$$x=\Phi(y,u) \tag{9}$$

The learning module 112 accordingly learns equations of state expressed by Expressions (2) and (3) given below and obtained by rewriting Expression (1) by using the internal variable x and the input variable u:

[Math. 19]

$$\dot{x}=A(u)x+f(u) \tag{2}$$

[Math. 20]

$$y=\Phi^{-1}(x,u) \tag{3}$$

By taking into account Expression (1), Expression (2) and Expression (3), a steady-state value of the output variable y corresponding to a given value of the input variable u, i.e., a value "y⁻" of the output variable y giving a time derivative "y·"=0 of the output variable y is determined according to Expression (10) and Expression (11) given below:

[Math. 21]

$$\bar{y}=\Phi^{-1}(\bar{x},u) \tag{10}$$

[Math. 22]

$$\bar{x}=-[A(u)]^{-1}f(u) \tag{11}$$

The effects of defining the outputs of the mapping ϕ included in the equation of state of Expression (1) by the internal variable x and the input variable u will be described later.

Furthermore, according to the embodiment, the learning module 112 employs the concept of a multilayer neural network to define Expression (4) to Expression (7) given below with respect to the mapping d:

[Math. 23]

$$\Phi(y,u)=y_\Phi^{(L_\Phi)} \tag{4}$$

[Math. 24]

$$y_\Phi^{(i)}=\Phi_\Phi^{(i)}\left(x_\Phi^{(i)},u\right) \tag{5}$$

[Math. 25]

$$x_\Phi^{(i)}=W_\Phi^{(i)}(u)y_\Phi^{(i-1)}+b_\Phi^{(i)}(u) \tag{6}$$

[Math. 26]

$$y_\Phi^{(0)}=y \tag{7}$$

where i denotes a layer number in the multilayer neural network; $L_\phi$ denotes the number of layers in the multilayer neural network; $\phi_\phi$ is an activation function and denotes an arbitrary bijective mapping that gives an output of an identical dimension with the dimension of an input thereof; $W_\phi$ denotes a weight; and $b_\phi$ denotes a bias. The activation function $\phi_\phi$, the weight $W_\phi$, and the bias $b_\phi$ may be set for each layer of the multilayer neural network.

The learning module 112 subsequently obtains an input-output data set $[y, u, \dot{y}, \dot{u}]$ including the output variable y, the input variable u, the time derivative $\dot{y}$ of the output variable y, and the time derivative $\dot{u}$ of the input variable u from the data set storage portion 122 (step S13). According to the embodiment, the input-output data set $[y, u, \dot{y}, \dot{u}]$ includes a data set of transient data $[y_j, u_j, \dot{y}_j, \dot{u}_j]$ (j=1 to $N_t$) and a data set of steady-state data $[\bar{y}_j, \bar{u}_j]$ (j=1 to $N_s$). In the obtained input-output data set, $[u_j, \dot{u}_j, \bar{u}_j]$ corresponds to data set of the input variable, and $[y_j, \dot{y}_j, \bar{y}_j]$ corresponds to the data set of the output variable; and $\bar{y}_j$ is data of the stead-state value of the output variable y, and $\bar{u}_j$ is data of the input variable u corresponding to the data of the steady-state value.

The learning module 112 subsequently gives the data set of the input variable to the model and estimates an output (step S14). More specifically, the learning module 112 gives a transient data portion $[u_j, \dot{u}_j]$ of the data set of the input variable $[u_j, \dot{u}_j, \bar{u}_j]$ obtained at step S13, to the equation of state of Expression (1) obtained and initialized at step S12. The learning module 112 accordingly obtains an estimated value of the output variable $\dot{y}_j$ in the system in the transient state (a left side of Expression (12) given below). In Expression (12), $(\partial\phi/\partial y)^{-1}$ and $(\partial\phi/\partial u)$ are functions of the output variable y and the input variable u and are thereby evaluable by substitution of the output variable $y_j$ and the input variable $u_j$.

[Math. 27]

$$\dot{y}_j = \left(\frac{\partial \Phi}{\partial y}\right)^{-1}\left\{A(u_j)\Phi(y_j, u_j) + f(u_j) - \frac{\partial \Phi}{\partial u}\dot{u}_j\right\} \tag{12}$$

The learning module 112 also gives a steady-state data portion $[\bar{u}_j]$ of the data set of the input variable $[u_j, \dot{u}_j, \bar{u}_j]$ obtained at step S13, to Expression (13) given below to obtain an estimated value of the output variable $\bar{y}_j$ in the system in the steady state (a left side of Expression (13):

[Math. 28]

$$\bar{y}_j = \Phi^{-1}(-(A(\bar{u}_j))^{-1} f(\bar{u}_j), \bar{u}_j) \tag{13}$$

The learning module 112 subsequently evaluates a matching degree of the estimated output with the data set of the output variable (step S15). More specifically, the learning module evaluates the matching degree of the estimated value of the output variable obtained at step S14 with the data set of the output variable $[y_j, \dot{y}_j, \bar{y}_j]$ obtained at step S13. With respect to the estimated value of the output variable $\dot{y}_j$ in the system in the transient state, the learning module 112 may evaluate the matching degree by using, for example, a mean square error (MSE) according to Expression (14) given below. With respect to the estimated value of the output variable $\bar{y}_j$ in the system in the steady state, the learning module 112 may evaluate the matching degree by using, for example, a mean square error (MSE) according to Expression (15) given below:

[Math. 29]

$$J_t = \frac{1}{N_t}\sum_{j=1}^{N_t}\left(\dot{y}_j - \hat{\dot{y}}_j\right)^2 \tag{14}$$

[Math. 30]

$$J_s = \frac{1}{N_s}\sum_{j=1}^{N_s}\left(\bar{y}_j - \hat{\bar{y}}_j\right)^2 \tag{15}$$

According to the embodiment, the learning module 112 calculates a total value $J_a$ of the matching degree from a matching degree $J_t$ on the left side of Expression (14) and a matching degree $J_s$ on the left side of Expression (15) by using a mathematical expression with addition of weighting as shown by Expression (16) given below:

[Math. 31]

$$J_a = \alpha J_t + \beta J_s \tag{16}$$

In Expression (16), α and β denote weighting factors that may be set arbitrarily. The smaller total value $J_a$ of the matching degree on the left side of Expression (16) indicates the higher matching degree. The learning module 112 may use another index such as a mean absolute error ratio or a cross entropy to evaluate the matching degree, in place of the mean square error.

The learning module 112 subsequently determines whether the matching degree is sufficient or not (step S16). For example, in the case of using Expression (16), the learning module 112 may determine that the matching degree is sufficient when the total value $J_a$ of the matching degree is equal to or smaller than a predetermined value. According to a modification, the learning module 112 may determine that the matching degree is sufficient when a rate of change in the total value $J_a$ of the matching degree is equal to or smaller than a predetermined value. The predetermined value may be determined arbitrarily.

When the matching degree is not sufficient (step S16: NO), the learning module 112 proceeds to step S17 to update the learning parameters in the model of Expression (1) defined at step S12: for example, the function A(u) and the function f(u) included in Expression (1), the activation function $\phi_\phi$, included in Expression (5), and the weight $W_\phi$ and the bias $b_\phi$ included in Expression (6). The learning module 112 may, for example, evaluate a gradient of the total value $J_a$ of the matching degree with respect to each of the learning parameters by back propagation and update the respective learning parameters based on any of various gradient methods. The learning module 112 then proceeds to step S14 and repeats the estimation and the evaluation of the output.

When the matching degree is sufficient (step S16: YES), on the other hand, the learning module 112 terminates the series of processing. In this case, the learning module 112 may output the learnt function F to the input-output module 150, may store the learnt function F in the storage module 120, or may send the learnt function F to another apparatus via the communication module 140.

The following describes a reason for ensuring the uniqueness of a stable solution in the model (equation of state) learnt by the model learning method described with reference to FIG. 2. In general, when a dynamic model that reproduces a transient phenomenon is established by a neural network (machine learning), there is no guarantee that the model is stable or, in other words, the model does not diverge. Expression (2) that is an equivalent transformation of the equation of state expressed by Expression (1) described above by using the internal variable x, which is obtained by converting the output variable y by using the mapping $\phi$, however, includes a linear differential equation with respect to the internal variable x. The mapping $\phi$ is a bijective mapping and accordingly has a unique inverse function. The internal variable x and the output variable y are convertible to each other, and the steady-state values of the internal variable x and the input variable u are convertible to each other, so that the stable solution of nonlinear Expression (1) is determinable by solving linearized Expression (2) with $\dot{x}=0$. Accordingly, the model learnt by the model learning apparatus 100 improves the prediction accuracy of the output from the system.

The advantageous effects of the model learning method by the model learning apparatus 100 according to the embodiment are described, based on comparison with a comparative example. The model learning method of the embodiment uses the input-output data set including the input value and the output value of the system in the steady state, as well as the input value and the output value of the system in the transient state, as learning data. A model learning method of the comparative example, on the other hand, uses input-output data that do not include the input value or the output value of the system in the steady state, as learning data.

Figure 3:
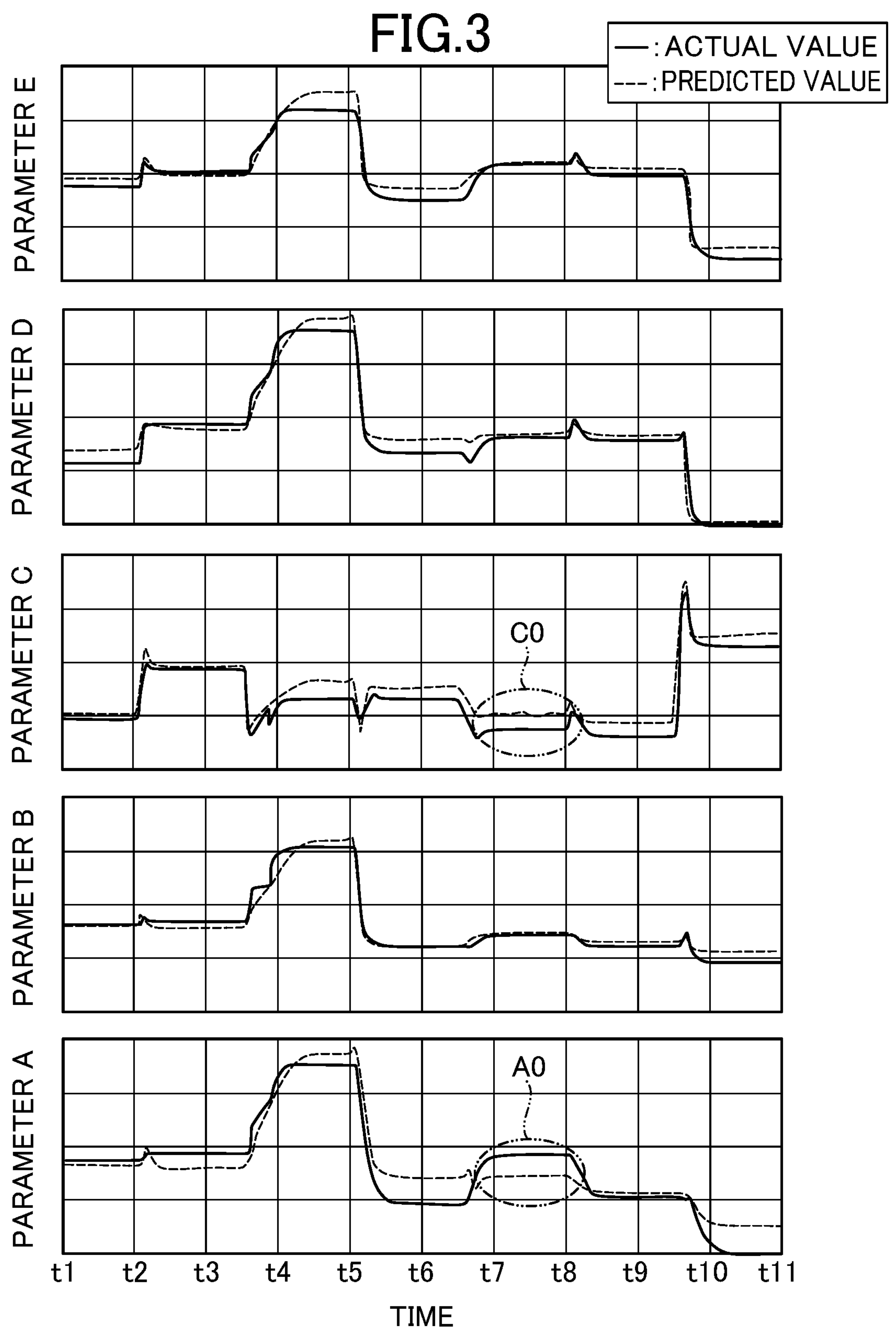
FIG. 3 is a diagram illustrating results of prediction of a model learnt by a learning method of a comparative example.

FIG. 3 is a diagram illustrating results of prediction of a model learnt by the learning method of the comparative example. FIG. 3 shows time changes of five parameters (parameters A, B, C, D and E) output from the system. In the graphs shown in FIG. 3, solid-line curves show actual output changes of the system, i.e., output changes expected to be predicted by the model, and broken-line curves show output changes predicted by the model learnt by the model learning method of the embodiment. In the model learning method of the comparative example, as shown in FIG. 3, there are large differences between the actual output changes (shown by the solid-line curves) and the predicted output changes (shown by the broken-line curves) (as shown by areas A0 and C0 encircled by two-dot chain lines), with regard to the outputs in the steady state shown, for example, in a time zone from a time t7 to a time t8.

Figure 4:
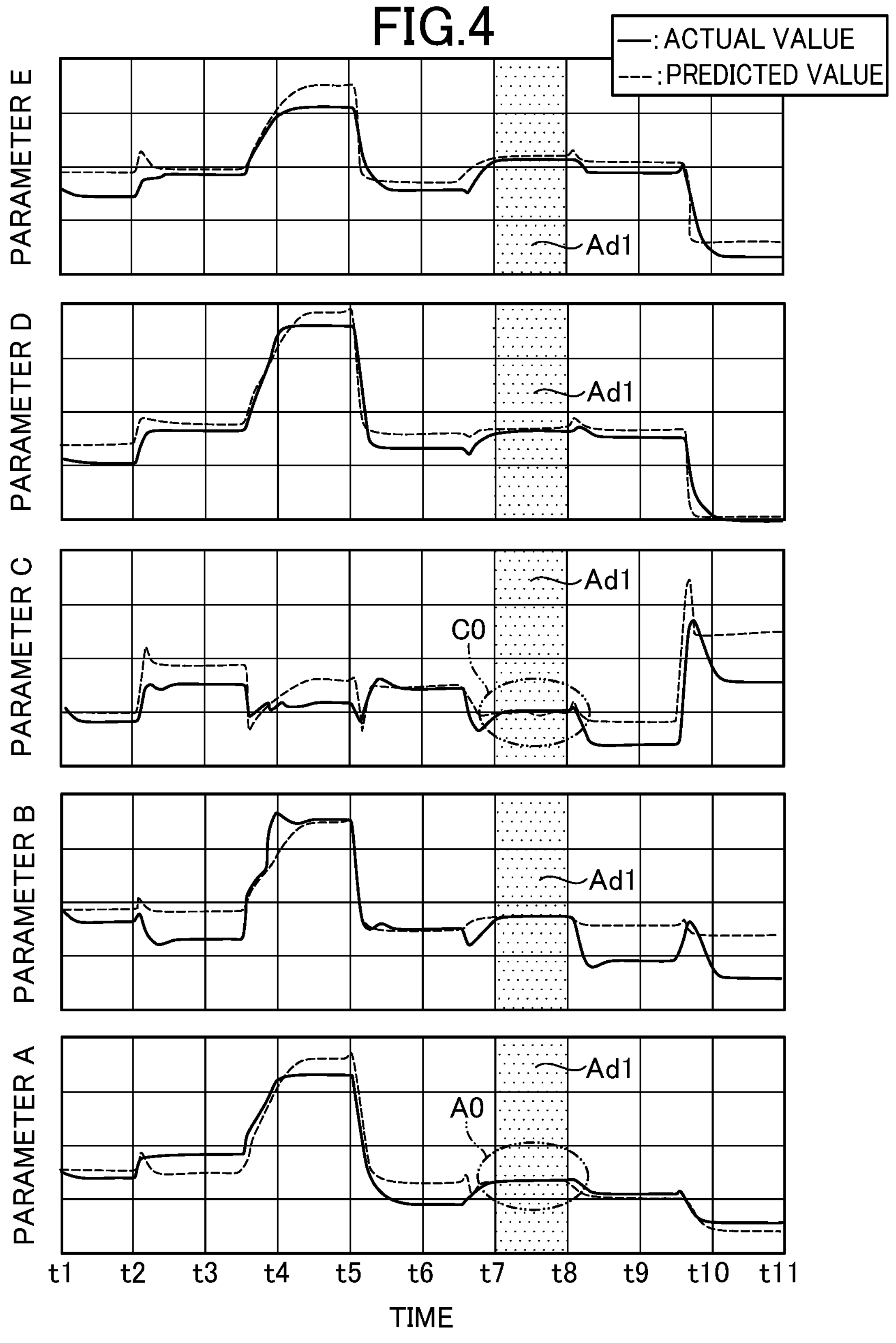
FIG. 4 is a diagram illustrating results of prediction of a model learnt by the learning method according to the first embodiment.

FIG. 4 is a diagram illustrating results of prediction of a model learnt by the learning method according to the first embodiment. FIG. 4 shows output changes predicted by using the model learnt by the model learning method of the embodiment (shown by broken-line curves) relative to the actual output changes of the system (shown by the solid-line curves) in FIG. 3. In the model learning method of the embodiment shown in FIG. 4, the model is learnt by using input-output data including steady-state data of input values into the system and steady-state data of output values from the system in a time period from a time t7 to a time t8. As shown in FIG. 4, in the time zone from the time t7 to the time t8 (dotted areas Ad1 in FIG. 4), there are smaller differences between the actual output changes and the estimated values of the output variables by the learnt model in the system in the steady state, compared with those of FIG. 3. These results show that the model learning method of the embodiment improves the prediction accuracy of the system in the steady state (steady-state accuracy).

In the model learning apparatus 100 of the embodiment described above, the learning module 112 learns the equation of state that is the model, by using the input-output data set including the set of data of the steady-state value of the output variable y and the data of the input variable u corresponding to the data of the steady-state value. More specifically, the learning module 112 learns the equation of state by using the set of the data of the output variable and the data of the input variable in the system in the steady state, in addition to the set of the data of the output variable and the data of the input variable in the system in the transient state. The model learnt by this model learning apparatus 100 is accordingly the model that takes into account the prediction accuracy of the output in the system in the steady state. Furthermore, the model that is learnt by the model learning apparatus 100 and that shows the relationship between the input variable u and the output variable y in the system is the equation of state including the bijective mapping $\phi$ with the output variable y as an input thereof. This provides a relatively small difference between the estimated value of the steady-state value uniquely determined and the actual steady-state value in the model learnt by the model learning apparatus 100. The model learning apparatus 100 is accordingly enabled to learn the model that improves the prediction accuracy of the steady-state value.

Moreover, in the model learning apparatus 100 of the embodiment, the mapping $\phi$ included in Expression (1) is a bijective mapping with the output variable y and the input variable u as its inputs. For example, in the case of using a function G, Expression (1) may be formally rewritten to provide $G^{-1}=\phi$. The model of Expression (1) includes the functions A(u) and f(u) with the input variable u as their inputs and also includes a time derivative term of the input variable u. The model of Expression (1) accordingly serves as a model that explicitly expresses the steady-state value of the output variable corresponding to the input variable and is thus enabled to determine the steady-state value of the output variable y output from the system in the steady state, as well as the output variable y output from the system in the transient state, with high accuracy. The model learning apparatus 100 of the embodiment is accordingly enabled to learn the model that improves the prediction accuracy of the steady-state value output form the system in the steady state.

In the model learning apparatus 100 of the embodiment, the equation of state of Expression (1) is linearized by defining the output of the mapping $\phi$ with its inputs set to the output variable y and the input variable u, as the internal variable x in the equation of state of Expression (1). This causes the equation of state shown by Expression (1) to serve as a model that explicitly expresses the steady-state value of the output variable corresponding to the input variable in the system in the steady state. The model learning apparatus 100 of the embodiment is accordingly enabled to learn the model that improves the prediction accuracy of the steady-state value output form the system in the steady state.

Furthermore, in the model learning apparatus 100 of the embodiment, the mapping $\phi$ included in Expression (1) is defined by using the multilayer neural network. This enables the value of the output variable y estimated by Expression (1) to approach an actual output of the system by adjusting the activation function $\phi_\phi$, the weight $W_\phi$, and the bias $b_\phi$ in each layer of the multilayer neural network. The model learning apparatus 100 of the embodiment is accordingly enabled to learn the model that predicts an actual output of the system with high accuracy.

Additionally, in the model learning apparatus 100 of the embodiment, the learning module 112 estimates the output by using the data set of the input variable that is included in the input-output data set and that includes the data of the input variable u corresponding to the data of the steady-state value. The learning module 112 evaluates the matching degree of the estimated output with the data set of the output variable y that is included in the input-output data set and that includes the data of the steady-state value of the output variable y and updates the learning parameters of the model according to the results of the evaluation, so as to learn the equation of state. The learning module 112 evaluates the equation of state learnt by using the data set of the input variable including the data of the input variable u corresponding to the data of the steady-state value and thereby modifies the learnt model to a model having the higher prediction accuracy. The model learning apparatus 100 of the embodiment is accordingly enabled to learn the model that further improves the prediction accuracy of the steady-state value.

Second Embodiment

FIG. 5 is a flowchart showing a model learning method according to a second embodiment. The model learning method of the second embodiment employs a different method of modifying the learning model.

In the model learning method of the second embodiment, the data set storage portion 122 first stores the input-output data set (step S21), like step S11 in the first embodiment. The learning module 112 subsequently obtains the model stored in the model storage portion 121 and initializes the variables included in the obtained model (step S22), like step S12 in the first embodiment.

The learning module 112 then obtains an input-output data set from the data set storage portion 122 (step S23) and gives the input data set to the model and estimates the output (step S24), like step S13 and step S14 in the first embodiment. At step S24, the learning module 112 calculates an estimated value of the output variable $y^{\cdot}_{j}$ in the system in the transient state and an estimated value of the output variable $y^{-}_{j}$ in the system in the steady state.

The learning module 112 subsequently evaluates the matching degree of the estimated value of the output variable $y^{\cdot}_{j}$ obtained at step S24 with the data set of the output variable $[y_j, y^{\cdot}_{j}, y^{-}_{j}]$ obtained at step S23 (step S25), like step S15 in the first embodiment. Like the first embodiment, the procedure of evaluating the matching degree at step S25 evaluates the total value $J_a$ of the matching degree that is calculated from the matching degree $J_t$ of the estimated value of the output variable $y^{\cdot}_{j}$ in the system in the transient state and the matching degree $J_s$ of the estimated value of the output variable $y^{-}_{j}$ in the system in the steady state.

The learning module 112 then determines whether the total value of the matching degree is sufficient (step S26), like step S16 in the first embodiment. When the total value of the matching degree is not sufficient (step S26: NO), the learning module 112 proceeds to step S27 to update the learning parameters in the model defined at step S22 and then goes back to step S24 to repeat the estimation and the evaluation of the output.

When it is determined at step S26 that the total value of the matching degree is sufficient (step S26: YES), on the other hand, the learning module 112 separately evaluates the matching degree $J_t$ of the estimated value of the output variable $y^{\cdot}_{j}$ in the system in the transient state and the matching degree $J_s$ of the estimated value of the output variable $y^{-}_{j}$ in the system in the steady state, with regard to the matching degree of the estimated value of the output variable $y^{\cdot}_{j}$ with the data set of the output variable $[y_j, y^{\cdot}_{j}, y^{-}_{j}]$ (step S28). For example, lower limit values may be provided respectively for the matching degrees of the estimated values in the transient state and in the steady state. When either of the matching degrees $J_t$ and $J_s$ is lower than the corresponding lower limit value (step S28: NO), the learning module 112 adds transient data or steady-state data to the input-output data set used in the processing of step S23 to step S25 in the immediately preceding cycle to create a new input-output data set (step S29). More specifically, when the matching degree $J_t$ is lower than its lower limit value, a new input-output data set is created by adding transient data. When the matching degree $J_s$ is lower than its lower limit value, a new input-output data set is created by adding steady-state data.

The learning module 112 then goes back to step S24 and gives the new input-output data set created at step S29 to the model and estimates the output (step S24). At step S25, the learning module 112 subsequently evaluates the total value $J_a$ of the matching degree of the newly estimated output with the data set of the output variable $[y_j, y^{\cdot}_{j}, y^{-}_{j}]$ included in the new input-output data created at step S29. When the total value $J_a$ of the matching degree is sufficient (step S26: YES), the learning module 112 separately evaluates the matching degree $J_t$ of the estimated value of the output variable $y^{\cdot}_{j}$ in the system in the transient state and the matching degree $J_s$ of the estimated value of the output variable $y^{-}_{j}$ in the system in the steady state at step S28. When both the matching degree $J_t$ in the system in the transient state and the matching degree $J_s$ in the system in the steady state are sufficient, the learning module 112 terminates the process. When either of the matching degrees $J_t$ and $J_s$ is lower than the corresponding lower limit value (step S28: NO), the learning module 112 further adds transient data or steady-state data to the new input-output data set to create a newer input-output data set (step S29).

Figure 6:
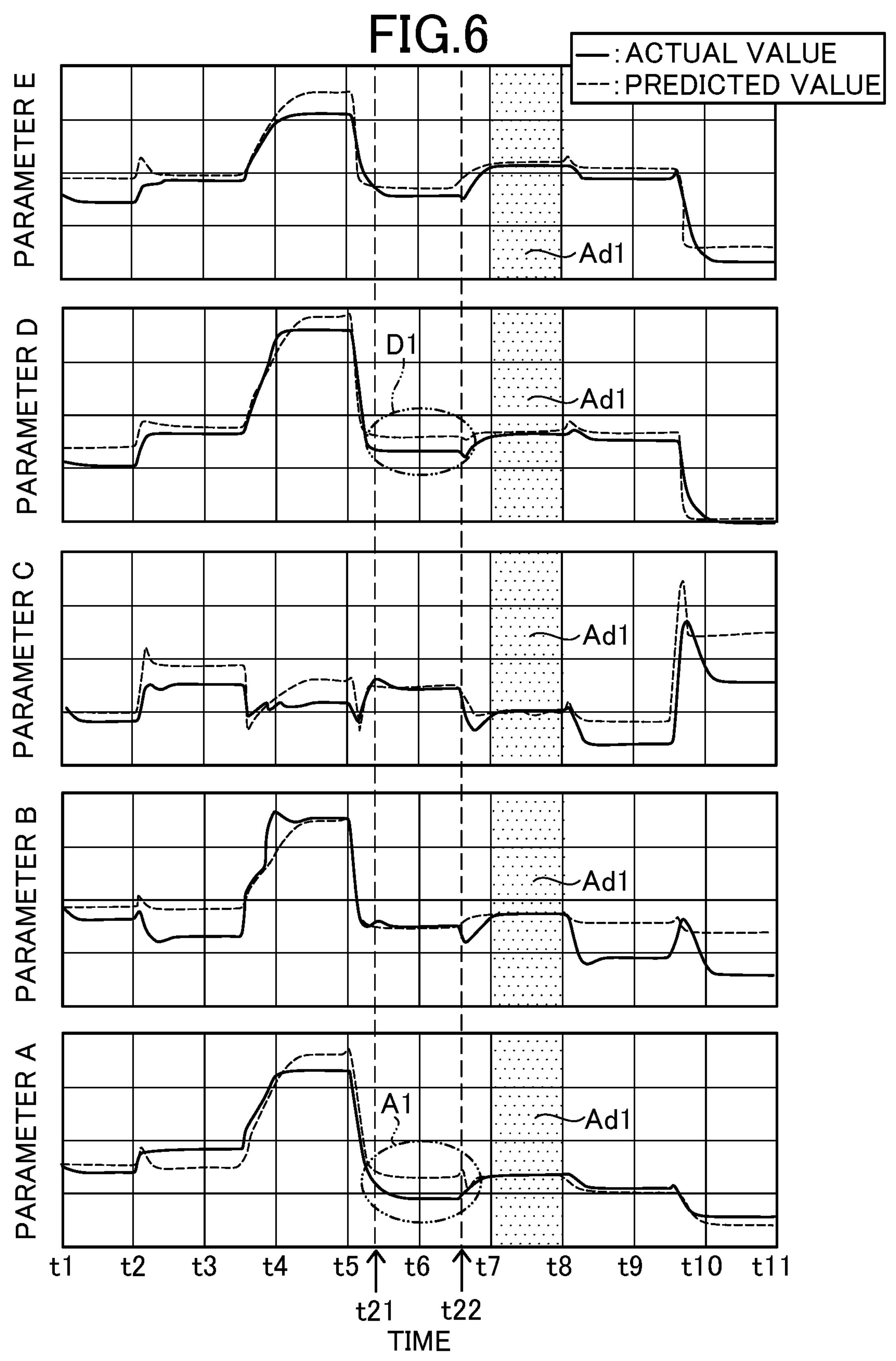
FIG. 6 is a first diagram illustrating results of prediction of a model learnt by the learning method according to the second embodiment.

FIG. 6 is a first diagram illustrating results of prediction of a model learnt by the learning method according to the second embodiment. The results of prediction of the model (shown by broken-line curves) in FIG. 6 are identical with those of the first embodiment shown in FIG. 4 and show the results of prediction of the model learnt once by using input-output data including steady-state data of input values into the system and steady-state data of output values from the system in a time period from a time t7 to a time t8. As shown in FIG. 6, in the time zone from the time t7 to the time t8 (dotted areas Ad1 in FIG. 6), the actual output changes of the system in the steady state substantially match the output changes predicted by the model. With regard to the outputs in a time zone from a time t21 to a time t22, however, there are relatively large differences between the actual output changes (shown by solid-line curves) and the predicted output changes (shown by the broken-line curves) (as shown by areas A1 and D1 encircled by two-dot chain lines).

Figure 7:
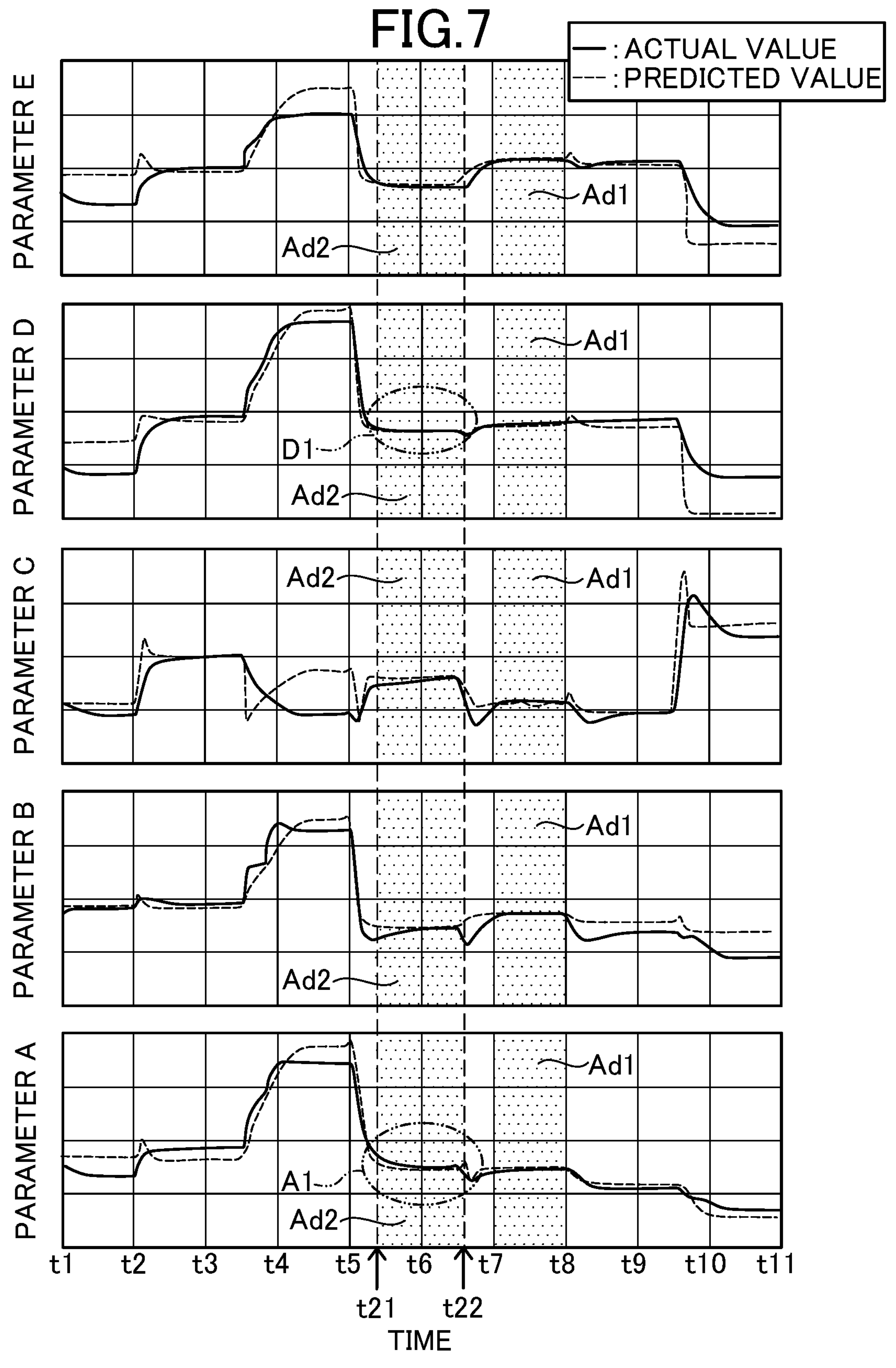
FIG. 7 is a second diagram illustrating results of prediction of the model learnt by the learning method according to the second embodiment.

FIG. 7 is a second diagram illustrating results of prediction of the model learnt by the learning method according to the second embodiment. The results of prediction of the model (shown by broken-line curves) in FIG. 7 show results of prediction of the model learnt by using new input-output data that is created by adding steady-state data to the input-output data as the learning data of the model making the prediction of FIG. 6. More specifically, these results of prediction (shown by the broken-line curves) show results of prediction of the model learnt by using input-output data that is newly created by adding steady-state data in the time zone from the time t21 to the time t22 when there are differences between the actual output changes (shown by the solid-line curves) and the predicted output changes (shown by the broken-line curves). As shown in FIG. 7, in the time zone from the time t21 to the time t22 (dotted areas Ad2 in FIG. 7), there are smaller differences between the actual output changes and the estimated values of the output variables by the learnt model, compared with those of FIG. 6. In some parameters, the actual output changes substantially match the estimated values of the output variables by the learnt model. These results show that the model learning method of this embodiment learns the model by using the new input-output data that is created by addition of steady-state data and thereby improves the prediction accuracy of the system in the steady state.

In the model learning apparatus 100 of this embodiment described above, the learning module 112 gives the data set of the input variable included in the input-output data set, to the model to estimate an output and evaluates the matching degree of the estimated output with the data set of the output variable included in the input-output data set. Based on the results of this evaluation, the learning module 112 newly learns the equation of state by using an input-output data set newly created by addition of a new set of data of the steady-state value of the output variable y and data of the input variable u corresponding to the data of the steady-state value to the input-output data set used for the estimation of the output and for the evaluation of the matching degree. For example, in the case of insufficient matching degree with the output variable y in the system in the steady-state, addition of the learning data with regard to the steady-state value improves the prediction accuracy of the steady-state value. The model learning apparatus 100 of this embodiment is accordingly enabled to learn the model that further improves the prediction accuracy of the steady-state value.

Furthermore, the model learning apparatus 100 of this embodiment evaluates the matching degree $J_t$ in the transient state at step S28 and adds transient data to create new input-output data used for newly learning the model. This configuration improves the prediction accuracy of the output values in the system in the transient state.

Third Embodiment

Figure 8:
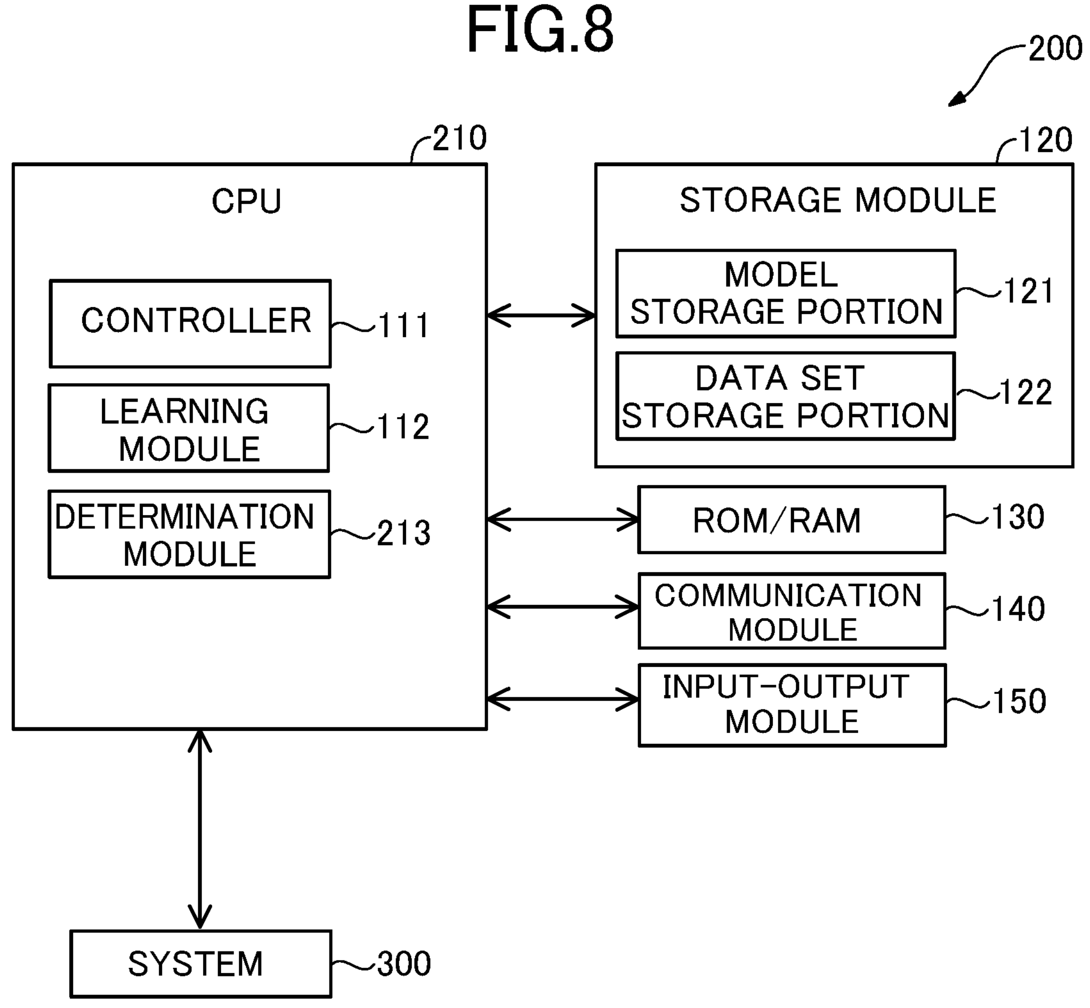
FIG. 8 is a schematic diagram illustrating the configuration of a control apparatus according to a third embodiment.

FIG. 8 is a schematic diagram illustrating the configuration of a control apparatus 200 according to a third embodiment. The control apparatus 200 of the third embodiment has a CPU 210 including a controller 111, a learning module 112 and a determination module 213.

The control apparatus 200 may be used as an in-vehicle ECU (electronic control unit). The control apparatus 200 of this embodiment may be used to control a system 300. Like the first embodiment, the system 300 is, for example, an internal combustion engine, a hybrid engine, or a power train. The control apparatus 200 may be configured by a computer and may be used to analyze the system 300.

The control apparatus 200 includes a CPU 210, a storage module 120, a ROM/RAM 130, a communication module 140 and an input-output module 150. The respective components of the control apparatus 200 are connected with each other by means of buses. At least part of the functional portions of the control apparatus 200 may be implemented by an ASIC (application specification integrated circuit).

The CPU 210 includes the controller 111, the learning module 112 and the determination module 213. Like the controller 111 of the first embodiment, the controller 111 loads a computer program stored in the ROM 130 and expands and executes the computer program on the RAM 130 to control the respective components of the control apparatus 200. The learning module 112 uses the model learning method described in the first embodiment or described in the second embodiment to learn a nonlinear equation of state for predicting an output variable y that indicates a state of the system 300. The determination module 213 uses the equation of state learnt by the learning module 112 to calculate an input for controlling a future output to become equal to a target value, from an output of the system at a present time. The control apparatus 200 outputs the calculated input to the system and thereby controls the system.

In the control apparatus 200 of this embodiment described above, the determination module 213 uses the equation of state learnt by the learning module 112 to determine the input variable u corresponding to the target value of the output variable y. The control apparatus 200 inputs the input variable determined by the determination module 213 into the system 300 and thereby controls the system 300 such as to make the output of the system 300 especially in the steady state equal to a target steady-state value.

MODIFICATIONS OF EMBODIMENTS

The present disclosure is not limited to the embodiments described above but may be implemented by a variety of other aspects without departing from the scope of the disclosure. Some examples of possible modification are given below. In the above embodiments, part of the configuration implemented by hardware may be replaced by software. On the contrary, part of the configuration implemented by software may be replaced by hardware.

Modification 1

The above embodiments illustrate the examples of the configuration of the model learning apparatus and the configuration of the control apparatus. The configuration of the model learning apparatus and the configuration of the control apparatus may, however, be modified in various ways and are not limited to the configurations of these embodiments. For example, at least one of the model learning apparatus and the control apparatus may be configured by cooperation of a plurality of information processing apparatuses (including a server apparatus and an in-vehicle ECU) located on a network.

Modification 2

The above embodiments illustrate the examples of the procedure of the model learning method (shown in FIG. 2 and FIG. 5). The procedure of this method may, however, be modified in various ways and is not limited to the procedures of these embodiments. For example, part of the steps may be omitted, or other steps that are not described herein may be added. The sequence of execution of part of the steps may also be changed.

Modification 3

In the embodiments described above, the equation of state is defined by Expression (1), and the output of the mapping $\phi$ included in Expression (1) is defined by the internal variable x shown by Expression (2). This definition of the mapping $\phi$ is, however, only illustrative, and the mapping $\phi$ may be defined in any form.

Modification 4

In the model learning method of the first embodiment (shown in FIG. 2) and in the model learning method of the second embodiment (shown in FIG. 5), the learning module 112 learns the model by using the matching degree calculated according to Expression (14) to Expression (16).

According to a modification, however, the learning module 112 may determine whether constraint conditions are satisfied, in addition to the evaluation of the matching degree. For example, the constraint conditions may respectively be set for the function A(u) and the function f(u) included in the equation of state of Expression (1).

Modification 5

In the first embodiment and the second embodiment, the mapping $\phi$ is defined by Expression (4) to Expression (7) using the concept of the neural network. The definition of the mapping $\phi$ is, however, not limited to this definition. The mapping $\phi$ may be any bijective mapping with the output variable y as its input.

Modification 6

When the result of evaluation of the estimated value by the learnt model does not satisfy the preset evaluation criterion, the procedure of the first embodiment described above changes the learning parameters to relearn the model and estimate the output. The procedure of the second embodiment described above creates a new input-output data set by addition of transient data or steady-state data to the input-output data set, in addition to changing the learning parameters, to relearn the model and estimate the output. The method of determination for relearning the model is, however, not limited to the procedures of these embodiments. Any other method may be employed as long as the method allows for determination of whether the estimated value of the output is close to the output value included in the input-output data set.

Modification 7

The model learning method of the second embodiment separately evaluates the matching degree $J_t$ in the transient state and the matching degree $J_s$ in the steady state. Like Expression (16) in the first embodiment, these matching degrees may be evaluated by using a mathematical expression with addition of weighting. The model learning method of the second embodiment evaluates the matching degree $J_t$ in the transient state and adds transient data to create new input-output data for newly learning the model. With a view to improving the prediction accuracy of the steady-state value, a modified procedure may make evaluation of only the matching degree $J_s$ in the steady state without making evaluation of the matching degree $J_t$ in the transient state.

The aspects of the present disclosure are described above, based on the embodiments and the modifications. The embodiments and the modifications described above are, however, presented to facilitate understanding of the present disclosure and are not at all intended to limit the present disclosure. The aspects of the present disclosure may be changed, altered, modified or improved without departing from the subject matter or the scope of the present disclosure and include equivalents thereof. Furthermore, any of the technical features may be omitted appropriately unless it is described as essential in the description hereof.

REFERENCE SIGNS LIST

100 model learning apparatus
110, 210 CPU
111 controller
112 learning module
120 storage module
121 model storage portion
122 data set storage portion
130 ROM/RAM
140 communication module
150 input-output module
200 control apparatus
213 determination module
300 system

What is claimed is:

1. A control apparatus that is an in-vehicle electronic control unit configured to control a system including an internal combustion engine, or a hybrid engine in a vehicle, the control apparatus comprising:

a model learning apparatus configured to learn a model that shows a relationship between an input variable u input into a system and an output variable y output from the system, the model learning apparatus comprising:

a storage that stores a model used to learn a nonlinear equation of state for predicting the output variable y by using the input variable u; and a processor programmed to learn the equation of state by using the model and an input-output data set including a set of data of a steady-state value of the output variable y and data of the input variable u corresponding to the data of the steady-state value, wherein the model is an equation of state including a bijective mapping $\phi$ that uses the output variable y as an input thereof, wherein the model is defined by an expression (1):

$$\dot{y}=\left(\frac{\partial\Phi}{\partial y}\right)^{-1}\left\{A(u)\Phi(y,u)+f(u)-\frac{\partial\Phi}{\partial u}\dot{u}\right\} \tag{1}$$

where a left side of an equal sign is a time derivative of an n-dimensional vector that indicates the output variable y, where n denotes an integer number; and in a right side of the equal sign, the input variable u is an m-dimensional vector that indicates an input variable affecting a change of the output variable y, where m denotes an integer number;

a function A is a function that gives an n×n matrix by using the input variable u as an input thereof;

the mapping $\phi$ is a function that gives an n-dimensional vector by using the output variable y and the input variable u as inputs thereof;

a function f is a function that gives an n-dimensional vector by using the input variable u as an input thereof; and a sign with a dot over the input variable u denotes a time derivative of the input variable u, wherein in the expression (1), when an output of the mapping $\phi$ with the output variable y and the input variable u as inputs thereof is defined as an internal variable x, the processor is programmed to learn the equation of state defined by an expression (2) and an expression (3):

$$\dot{x}=A(u)x+f(u) \tag{2}$$

$$y=\Phi^{-1}(x,u) \tag{3}$$

wherein expression (2) is linear with respect to the internal variable x, wherein the processor is programmed to determine the input variable u corresponding to a target value of the output variable y by using the equation of state learnt by the processor, (i) the output variable y is at least one of an output value of the internal combustion engine, an emission amount of carbon dioxide, and an emission amount of hydrocarbons in a case of the internal combustion engine, or (ii) the output variable y is at least one of an output value of the internal combustion engine, an output value of a motor, a power storage amount of a battery, and a limiting value of the power storage amount in a case of the hybrid engine, and the control apparatus is configured to input the input variable determined by the processor into the system and thereby controls the system such as to make the output of the system in a steady state equal to a target steady-state value, so as to improve stability of an output from the internal combustion engine or the hybrid engine to a target value.

2. The control apparatus according to claim 1, wherein the mapping $\phi$ is defined by an expression (4) to an expression (7):

$$\Phi(y, u) = y_\Phi^{(L_\Phi)} \tag{4}$$

$$y_\Phi^{(i)} = \Phi_\Phi^{(i)}\left(x_\Phi^{(i)}, u\right) \tag{5}$$

$$x_\Phi^{(i)} = W_\Phi^{(i)}(u) y_\Phi^{(i-1)} + b_\Phi^{(i)}(u) \tag{6}$$

$$y_\Phi^{(0)} = y \tag{7}$$

where i denotes a layer number in a multilayer neural network; $L_\phi$ denotes number of layers in the multilayer neural network; $\phi_\phi$ is an activation function and denotes an arbitrary bijective mapping that gives an output of an identical dimension with a dimension of an input thereof; $W_\phi$ denotes a weight; and $b_\phi$ denotes a bias.

3. The control apparatus according to claim 2, wherein the processor is programmed to:

give a data set of the input variable that is included in the input-output data set and that includes the data of the input variable u corresponding to the data of the steady-state value, to the model and estimate an output;

evaluate a matching degree of the estimated output with a data set of the output variable that is included in the input-output data set and that includes the data of the steady-state value of the output variable y; and update a learning parameter of the model according to a result of the evaluation, so as to learn the equation of state.

4. The control apparatus according to claim 2, wherein the processor is programmed to:

give a data set of the input variable that is included in the input-output data set and that includes the data of the input variable u corresponding to the data of the steady-state value, to the model and estimate an output;

evaluate a matching degree of the estimated output with a data set of the output variable that is included in the input-output data set and that includes the data of the steady-state value of the output variable y;

create a new input-output data set according to a result of the evaluation by adding a new set of data of a steady-state value of the output variable y and data of the input variable u corresponding to the data of the steady-state value, to the input-output data set used for the estimation of the output and the evaluation of the matching degree; and learn the equation of state by using the new input-output data set.

5. The control apparatus according to claim 1, wherein the processor is programmed to:

give a data set of the input variable that is included in the input-output data set and that includes the data of the input variable u corresponding to the data of the steady-state value, to the model and estimate an output;

evaluate a matching degree of the estimated output with a data set of the output variable that is included in the input-output data set and that includes the data of the steady-state value of the output variable y; and update a learning parameter of the model according to a result of the evaluation, so as to learn the equation of state.

6. The control apparatus according to claim 1, wherein the processor is programmed to:

give a data set of the input variable that is included in the input-output data set and that includes the data of the input variable u corresponding to the data of the steady-state value, to the model and estimate an output;

evaluate a matching degree of the estimated output with a data set of the output variable that is included in the input-output data set and that includes the data of the steady-state value of the output variable y;

create a new input-output data set according to a result of the evaluation by adding a new set of data of a steady-state value of the output variable y and data of the input variable u corresponding to the data of the steady-state value, to the input-output data set used for the estimation of the output and the evaluation of the matching degree; and learn the equation of state by using the new input-output data set.

7. The control apparatus according to claim 1, wherein the mapping $\phi$ is defined by an expression (4) to an expression (7):

$$\Phi(y, u) = y_\Phi^{(L_\Phi)} \tag{4}$$

$$y_\Phi^{(i)} = \Phi_\Phi^{(i)}\left(x_\Phi^{(i)}, u\right) \tag{5}$$

$$x_\Phi^{(i)} = W_\Phi^{(i)}(u) y_\Phi^{(i-1)} + b_\Phi^{(i)}(u) \tag{6}$$

$$y_\Phi^{(0)} = y \tag{7}$$

where i denotes a layer number in a multilayer neural network; $L_\phi$ denotes number of layers in the multilayer neural network; $\phi_\phi$ is an activation function and denotes an arbitrary bijective mapping that gives an output of an identical dimension with a dimension of an input thereof; $W_\phi$ denotes a weight; and $b_\phi$ denotes a bias, wherein the processor is programmed to:

give a data set of the input variable that is included in the input-output data set and that includes the data of the input variable u corresponding to the data of the steady-state value, to the model and estimate an output;

calculate a matching degree of the estimated output with a data set of the output variable that is included in the input-output data set and that includes the data of the steady-state value of the output variable y;

give a data set of the input variable that is included in the input-output data set and that includes the data of the input variable u corresponding to the data of a transient-state value, to the model and estimate an output;

calculate a matching degree of the estimated output with a data set of the output variable that is included in the input-output data set and that includes the data of the transient-state value of the output variable y; and calculate a total value of the matching degree from the matching degree of the steady-state and the matching degree of the transient-state.

* * * * *